(12) United States Patent
Wang

(10) Patent No.: US 9,563,084 B2
(45) Date of Patent: Feb. 7, 2017

(54) LIQUID CRYSTAL DISPLAY DEVICE AND ARRAY SUBSTRATE THEREOF

(71) Applicant: Shenzhen China Star Optoelectronics Technology Co., Ltd., Shenzhen, Guangdong (CN)

(72) Inventor: Meng Wang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 217 days.

(21) Appl. No.: 14/426,108

(22) PCT Filed: Dec. 17, 2014

(86) PCT No.: PCT/CN2014/094063
§ 371 (c)(1),
(2) Date: Mar. 4, 2015

(87) PCT Pub. No.: WO2016/090657
PCT Pub. Date: Jun. 16, 2016

(65) Prior Publication Data
US 2016/0342035 A1    Nov. 24, 2016

(30) Foreign Application Priority Data
Dec. 12, 2014 (CN) .......................... 2014 1 0768709

(51) Int. Cl.
G02F 1/1343 (2006.01)
G02F 1/1362 (2006.01)
G02F 1/1368 (2006.01)
H01L 27/12 (2006.01)

(52) U.S. Cl.
CPC ....... *G02F 1/134309* (2013.01); *G02F 1/1362* (2013.01); *G02F 1/1368* (2013.01); *G02F 1/136227* (2013.01); *G02F 1/136286* (2013.01); *H01L 27/124* (2013.01); *G02F 2201/123* (2013.01); *G02F 2201/40* (2013.01)

(58) Field of Classification Search
CPC combination set(s) only.
See application file for complete search history.

(56) References Cited

U.S. PATENT DOCUMENTS

| | | | |
|---|---|---|---|
| 8,350,795 B2* | 1/2013 | Kim | G02F 1/136286 345/204 |
| 2010/0073273 A1* | 3/2010 | Nam | G02F 1/136286 345/92 |

* cited by examiner

*Primary Examiner* — Kyoung Lee
*Assistant Examiner* — Ratisha Mehta
(74) *Attorney, Agent, or Firm* — Andrew C. Cheng

(57) ABSTRACT

A liquid crystal display device and an array substrate thereof are provided. The array substrate includes: a first data line and a second data line extending along a first direction and being spacedly disposed along a second direction perpendicular to the first direction; a first pixel electrode and a second pixel electrode disposed between the first and the second data lines and spaced from each other along the second direction, the first pixel electrode being disposed adjacent to the first data line, the second pixel electrode being disposed adjacent to the second data line, the first data line being configured for providing a grayscale voltage to the second pixel electrode, the second data line being configured for providing a grayscale voltage to the first pixel electrode. By the above solution, the invention can ensure the display quality of the liquid crystal display device and increase the pixel aperture ratio.

20 Claims, 2 Drawing Sheets

LIQUID CRYSTAL DISPLAY DEVICE AND ARRAY SUBSTRATE THEREOF

TECHNICAL FIELD

The invention relates to the field of liquid crystal display technology, and particularly to a liquid crystal display device and an array substrate thereof.

DESCRIPTION OF RELATED ART

In a conventional design of pixel structure, a data line is electrically connected with neighboring pixel electrodes through thin film transistors and provides grayscale voltages to the pixel electrodes. Because a component arrangement space occupied by the thin film transistor in the extending direction of the data line is large, in order to ensure the pixel aperture ratio, two pixel aperture areas between neighboring two data lines cannot be arranged in parallel along an extending direction of scan line. However, such arrangement would reduce the commonality of RGB mask, increase the manufacturing cost of pixel electrode, cause the pixel aperture area easily to generate an optical interference with an optical film of the liquid crystal display device and thereby degrade the display quality of the liquid crystal display device. If maintaining the two pixel aperture areas to be arranged in parallel along the extending direction of scan line, areas of the aperture areas must be reduced, resulting in the reduction of pixel aperture ratio.

SUMMARY

Accordingly, embodiments of the invention provide a liquid crystal display device and an array substrate thereof, which can ensure the display quality of the liquid crystal display device and increase the pixel aperture ratio.

A technical solution proposed by the invention is to provide an array substrate. The array substrate includes: a first data line and a second data line, wherein the first data line and the second data line extend along a first direction and are spacedly disposed along a second direction perpendicular to the first direction; a first pixel electrode and a second pixel electrode, wherein the first pixel electrode and the second pixel electrode are disposed between the first data line and the second data line and spaced from each other along the second direction, the first pixel electrode is disposed adjacent to the first data line, the second pixel electrode is disposed adjacent to the second data line, the first data line is configured for supplying a grayscale voltage to the second pixel electrode, and the second data line is configured for supplying a grayscale voltage to the first pixel electrode; a first thin film transistor and a second thin film transistor disposed between the first data line and the second data line, wherein the first data line is electrically connected to a source of the first thin film transistor, the second pixel electrode is electrically connected to a drain of the first thin film transistor, the second data line is electrically connected to a source of the second thin film transistor, and the first pixel electrode is electrically connected to a drain of the second thin film transistor; a first via hole and a second via hole, wherein the first via hole and the second via hole respectively are arranged on same straight lines with the first thin film transistor and the second thin film transistor along a direction perpendicular to the first data line as well as the second data line, the second pixel electrode is electrically connected to the drain of the first thin film transistor through the first via hole, and the first pixel electrode is electrically connected to the drain of the second thin film transistor through the second via hole.

In an embodiment, the first pixel electrode and the second pixel electrode respectively have a first aperture area and a second aperture area formed there-above, the first aperture area and the second aperture area are aligned along the second direction.

Another technical solution proposed by the invention is to provide an array substrate. The array substrate includes: a first data line and a second data line, wherein the first data line and the second data line extend along a first direction and are spacedly disposed along a second direction perpendicular to the first direction; a first pixel electrode and a second pixel electrode, wherein the first pixel electrode and the second pixel electrode are disposed between the first data line and the second data line and spaced from each other along the second direction, the first pixel electrode and the first data line are disposed adjacent to each other, the second pixel electrode and the second data line are disposed adjacent to each other, the first data line is configured for supplying a grayscale voltage to the second pixel electrode, and the second data line is configured for supplying a grayscale voltage to the first pixel electrode.

In an embodiment, the array substrate further includes a first thin film transistor and a second thin film transistor disposed between the first data line and the second data line, the first data line is electrically connected to one of a source and a drain of the first thin film transistor, the second pixel electrode is electrically connected to the other one of the source and the drain of the first thin film transistor, the second data line is electrically connected to one of a source and a drain of the second thin film transistor, and the first pixel electrode is electrically connected to the other one of the source and the drain of the second thin film transistor.

In an embodiment, the first thin film transistor and the second thin film transistor are spacedly disposed along the first direction and respectively at opposite sides of the first pixel electrode as well as the second pixel electrode.

In an embodiment, the first pixel electrode and the second pixel electrode are aligned along the second direction.

In an embodiment, the first pixel electrode and the second pixel electrode respectively have a first aperture area and a second aperture area formed there-above, the first aperture area and the second aperture area are aligned along the second direction.

In an embodiment, the array substrate further includes a first scan line and a second scan line, the first scan line and the second scan line extend along the second direction and spaced from each other along the first direction; the first pixel electrode, the second pixel electrode, the first thin film transistor and the second thin film transistor further are located between the first scan line and the second scan line, the first scan line is disposed adjacent to the first thin film transistor and electrically connected to a gate of the first thin film transistor, the second scan line is disposed adjacent to the second thin film transistor and electrically connected to a gate of the second thin film transistor.

In an embodiment, the array substrate further is formed with a first via hole and a second via hole, the second pixel electrode is electrically connected to the other one of the source and the drain of the first thin film transistor through the first via hole, the first pixel electrode is electrically connected to the other one of the source and the drain of the second thin film transistor through the second via hole.

In an embodiment, the first via hole and the first thin film transistor are spacedly disposed along the second direction, the second via hole and the second thin film transistor are spacedly disposed along the second direction.

In an embodiment, the first via hole and the first thin film transistor are disposed on a same straight line along the second direction, the second via hole and the second thin film transistor are disposed on a same straight line along the second direction.

In order to solve the above technical problem, a technical solution proposed by the invention is to provide a liquid crystal display device including an array substrate. The array substrate includes: a first data line and a second data line, wherein the first data line and the second data line extend along a first direction and are spacedly disposed along a second direction perpendicular to the first direction; a first pixel electrode and a second pixel electrode, wherein the first pixel electrode and the second pixel electrode are disposed between the first data line and the second data line and spaced from each other along the second direction, the first pixel electrode and the first data line are disposed adjacent to each other, the second pixel electrode and the second data line are disposed adjacent to each other, the first data line is configured for supplying a grayscale voltage to the second pixel electrode, and the second data line is configured for supplying a grayscale voltage to the first pixel electrode.

In an embodiment, the array substrate further includes a first thin film transistor and a second thin film transistor disposed between the first data line and the second data line, the first data line is electrically connected to one of a source and a drain of the first thin film transistor, the second pixel electrode is electrically connected to the other one of the source and the drain of the first thin film transistor, the second data line is electrically connected to one of a source and a drain of the second thin film transistor, and the first pixel electrode is electrically connected to the other one of the source and the drain of the second thin film transistor.

In an embodiment, the first thin film transistor and the second thin film transistor are spacedly disposed along the first direction and respectively at opposite sides of the first pixel electrode as well as the second pixel electrode.

In an embodiment, the first pixel electrode and the second pixel electrode are aligned along the second direction.

In an embodiment, the first pixel electrode and the second pixel electrode respectively have a first aperture area and a second aperture area formed there-above, the first aperture area and the second aperture area are aligned along the second direction.

In an embodiment, the array substrate further includes a first scan line and a second scan line, the first scan line and the second scan line extend along the second direction and spaced from each other along the first direction; the first pixel electrode, the second pixel electrode, the first thin film transistor and the second thin film transistor further are located between the first scan line and the second scan line, the first scan line is disposed adjacent to the first thin film transistor and electrically connected to a gate of the first thin film transistor, the second scan line is disposed adjacent to the second thin film transistor and electrically connected to a gate of the second thin film transistor.

In an embodiment, the array substrate further is formed with a first via hole and a second via hole, the second pixel electrode is electrically connected to the other one of the source and the drain of the first thin film transistor through the first via hole, the first pixel electrode is electrically connected to the other one of the source and the drain of the second thin film transistor through the second via hole.

In an embodiment, the first via hole and the first thin film transistor are spacedly disposed along the second direction, the second via hole and the second thin film transistor are spacedly disposed along the second direction.

In an embodiment, the first via hole and the first thin film transistor are disposed on a same straight line along the second direction, the second via hole and the second thin film transistor are disposed on a same straight line along the second direction.

By means of the above technical solutions, the efficacy can be achieved by the invention is that: the array substrate of various embodiments of the invention is designed to be that a first data line and a second data line extend along a first direction and are spacedly disposed along a second direction perpendicular to the first direction, a first pixel electrode and a second pixel electrode are disposed between the first data line and the second data line and spaced from each other along the second direction, the first pixel electrode is disposed adjacent to the first data line, the second pixel electrode is disposed adjacent to the second data line, the first data line is for providing a grayscale voltage to the second pixel electrode, and the second data line is for providing a grayscale voltage to the first pixel electrode, and increases the component arrangement space along the extending direction of data line, so that components connected with the pixel electrodes can be horizontally disposed along the extending direction of scan line and two pixel aperture areas between neighboring two data lines can be disposed in parallel along the extending direction of scan line. As a result, the display quality of the liquid crystal display device can be ensured and the pixel aperture ratio can be increased.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
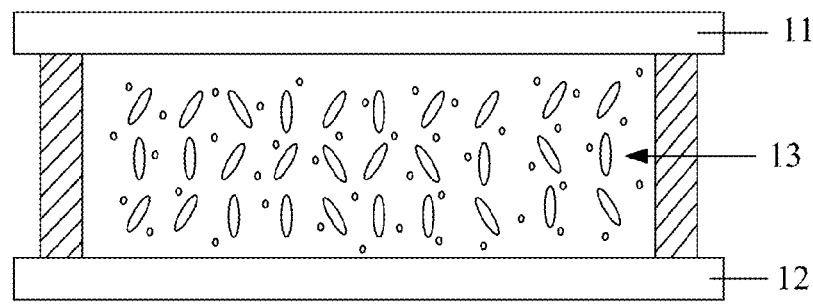
FIG. 1 is a schematic structural view of a liquid crystal display panel according to a preferred embodiment of the invention.
Figure 2:
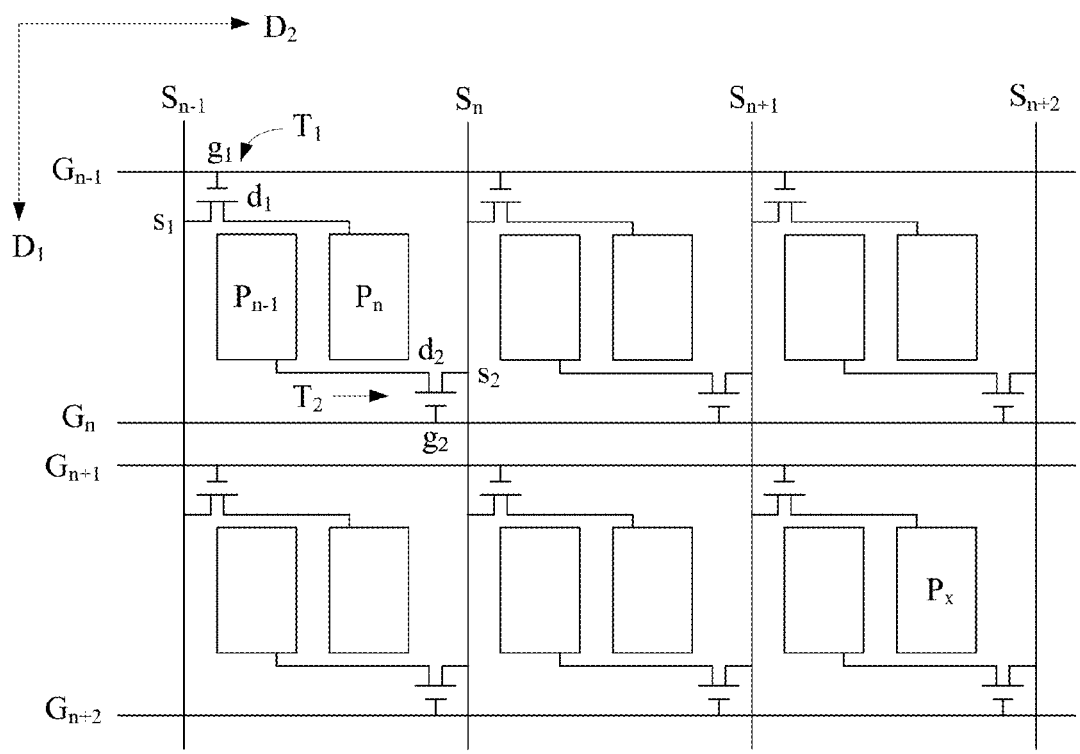
FIG. 2 is a schematic partial view of a pixel structure of the liquid crystal display panel as shown in FIG. 1.

FIG. 1 is a schematic structural view of a liquid crystal display panel according to a preferred embodiment of the invention, and FIG. 2 is a schematic partial view of a pixel structure of the liquid crystal display device as shown in FIG. 1. Referring to FIG. 1 and FIG. 2 together, the liquid crystal display panel 10 includes a first substrate 11, a second substrate 12 and a liquid crystal layer 13. The first substrate 11 and the second substrate 12 are arranged opposite to each other, the second substrate 12 may be a CF (color filter) substrate, and correspondingly the first substrate 11 may be a TFT (thin film transistor) array substrate.

The first substrate 11 includes a transparent base and various wirings and pixel electrodes, etc. disposed on the transparent base. Specifically, the first substrate 11 includes multiple (i.e., more than one) data lines $S_{n-1}$, $S_n$, $S_{n+1}$, $S_{n+2}$, multiple scan lines $G_{n-1}$, $G_n$, $G_{n+1}$, $G_{n+2}$ disposed perpendicular to the data lines $S_{n-1}$, $S_n$, $S_{n+1}$, $S_{n+2}$, and multiple pixel units $P_{n-1}$, $P_n$, ..., $P_x$, defined by the scan lines and the data lines. The scan lines $G_{n-1}$, $G_n$, $G_{n+1}$, $G_{n+2}$ are connected to a gate driver, the data lines $S_{n-1}$, $S_n$, $S_{n+1}$, $S_{n+2}$ are connected to a source driver, the gate driver is configured (i.e., structured and arranged) for supplying scan voltages to the pixel units $P_{n-1}$, $P_n$, ..., $P_x$ through corresponding scan lines, and the source driver is configured for supplying grayscale voltages to the pixel units $P_{n-1}$, $P_n$, ..., $P_x$ through corresponding data lines.

Referring to FIG. 2, each neighboring two data lines and corresponding neighboring two scan lines together define two pixel aperture areas with a same structure, each pixel aperture area includes one pixel electrode, and hereinafter this embodiment takes the two pixel aperture areas defined by the first data line $S_{n-1}$, the second data line $S_n$, the first scan line $G_{n-1}$ and the second scan line $G_n$ as an example for the purpose of illustration.

The first data line $S_{n-1}$ and the second data line $S_n$ extend along a first direction $D_1$ and are spacedly disposed along a second direction $D_2$, the first scan line $G_{n-1}$ and the second scan line $G_n$ extend along the second direction $D_2$ and are spacedly disposed along the first direction $D_1$, and the first direction $D_1$ and the second direction $D_2$ are mutually perpendicular to each other.

The first pixel electrode $P_{n-1}$ and the second pixel electrode $P_n$ are disposed between the first data line $S_{n-1}$ and the second data line $S_n$ and spaced from each other along the second direction $D_2$. The first pixel electrode $P_{n-1}$ is disposed adjacent to the first data line $S_{n-1}$, the second pixel electrode $P_n$ is disposed adjacent to the second data line $S_n$, the first data line $S_{n-1}$ is for supplying a grayscale voltage to the second pixel electrode $P_n$, and the second data line $S_n$ is for supplying a grayscale voltage to the first pixel electrode $P_{n-1}$.

The first data line $S_{n-1}$ and the second data line $S_n$ have a first thin film transistor $T_1$ and a second thin film transistor $T_2$ disposed therebetween, the first thin film transistor $T_1$ and the second thin film transistor $T_2$ are spacedly disposed along the first direction $D_1$ and respectively at opposite sides of the first pixel electrode $P_{n-1}$ as well as the second pixel electrode $P_n$. The first pixel electrode $P_{n-1}$ and the second pixel electrode $P_n$ are aligned with each other along the second direction $D_2$.

Moreover, the first pixel electrode $P_{n-1}$, the second pixel electrode $P_n$, the first thin film transistor $T_1$ and the second thin film transistor $T_2$ further are disposed between the first scan line $G_{n-1}$ and the second scan line $G_n$. The first scan line $G_{n-1}$ is disposed adjacent to the first thin film transistor $T_1$ and electrically connected with a gate $g_1$ of the first thin film transistor T1, the second scan line $G_n$ is disposed adjacent to the second thin film transistor $T_2$ and electrically connected to a gate $g_2$ of the second thin film transistor $T_2$.

In addition, the first data line $S_{n-1}$ is electrically connected to a source $s_1$ of the first thin film transistor $T_1$, and the second pixel electrode $P_n$ is electrically connected to a drain $d_1$ of the first thin film transistor $T_1$. The second data line $S_n$ is electrically connected to a source s2 of the second thin film transistor $T_2$, and the first pixel electrode $P_{n-1}$ is electrically connected to a drain $d_2$ of the second thin film transistor $T_2$.

Figure 3:
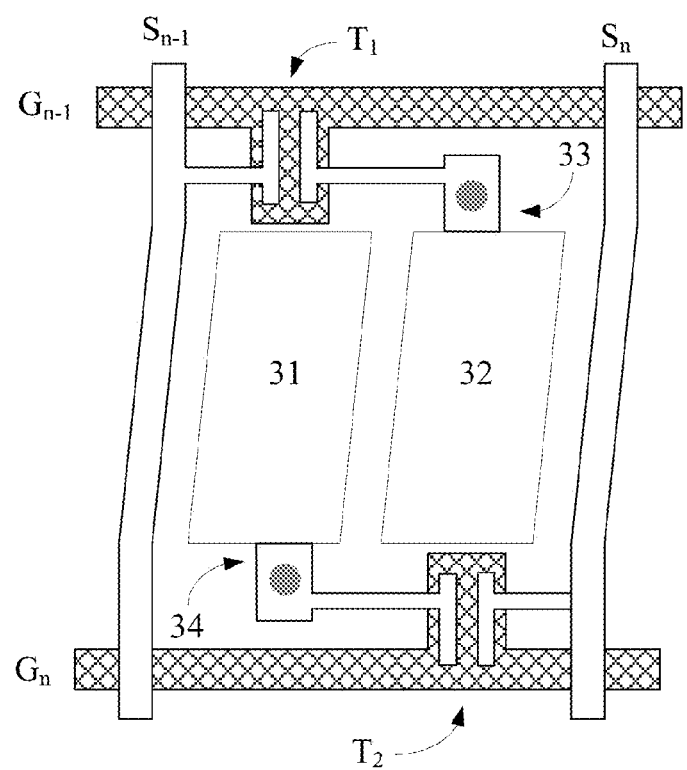
FIG. 3 is a schematic partial view of an array substrate having the pixel structure of FIG. 2 according to the invention.

FIG. 3 is a schematic partial view of an array substrate having the pixel structure of FIG. 2 according to the invention. In conjunction with the illustration of FIG. 3, the first pixel electrode Pn−1 and the second pixel electrode Pn respectively have a first aperture area 31 and a second aperture area 32 formed there-above, the first aperture area 31 and the second aperture area 32 are aligned with each other along the second direction $D_2$. The array substrate 11 further is formed with a first via hole 33 and a second via hole 34. The first via hole 33 and the first thin film transistor $T_1$ are spacedly disposed along the second direction $D_2$, the second via hole 34 and the second thin film transistor $T_2$ are spacedly disposed along the second direction $D_2$, the second pixel electrode $P_n$ is electrically connected to the drain $d_1$ of the first thin film transistor $T_1$ through the first via hole 33, and the first pixel electrode $P_{n-1}$ is electrically connected to the drain $d_2$ of the second thin film transistor $T_2$ through the second via hole 34.

In other embodiment, the first data line $S_{n-1}$ may be electrically connected to the drain $d_1$ of the first thin film transistor $T_1$, the second pixel electrode $P_n$ is electrically connected to the source $s_1$ of the first thin film transistor $T_1$, the second data line $S_n$ is electrically connected to the drain $d_2$ of the second thin film transistor $T_2$, and the first pixel electrode $P_{n-1}$ is electrically connected to the source $s_2$ of the second thin film transistor $T_2$. At this situation, the second pixel electrode $P_n$ is electrically connected to the source $s_1$ of the first thin film transistor $T_1$ through the first via hole 33, and the first pixel electrode $P_{n-1}$ is electrically connected to the source $s_2$ of the second thin film transistor $T_2$ through the second via hole 34.

The embodiments of the invention can increase the component arrangement space in the extending direction of data line, for example, the component arrangement space between the first data line $S_{n-1}$ and the second pixel electrode $P_n$ along the second direction $D_2$, so that the first via hole 33 and the first thin film transistor $T_1$ are disposed on a same straight line along the second direction $D_2$, the second via hole 34 and the second thin film transistor $T_2$ are disposed on a same straight line along the second direction $D_2$, and the first aperture area 31 and the second aperture area 32 are located on a same straight line. As a result, the pixel aperture ratio can be increased while ensuring the display quality of the liquid crystal display panel 10.

An embodiment of the invention also provides a liquid crystal display device. The liquid crystal display device includes the liquid crystal display panel 10 as shown in FIG. 1 and of course includes the array substrate 11 having the pixel structure according to the embodiment associated with FIG. 2 and FIG. 3, and therefore has the same technical effect.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An array substrate comprising:
   a first data line and a second data line, wherein the first data line and the second data line extend along a first direction and are spacedly disposed along a second direction perpendicular to the first direction;
   a first pixel electrode and a second pixel electrode, wherein the first pixel electrode and the second pixel electrode are disposed between the first data line and the second data line and spaced from each other along the second direction, the first pixel electrode is disposed adjacent to the first data line, the second pixel electrode is disposed adjacent to the second data line, the first data line is configured for supplying a grayscale voltage to the second pixel electrode, and the second data line is configured for supplying a grayscale voltage to the first pixel electrode;
   a first thin film transistor and a second thin film transistor disposed between the first data line and the second data line, wherein the first data line is electrically connected to a source of the first thin film transistor, the second pixel electrode is electrically connected to a drain of the first thin film transistor, the second data line is electrically connected to a source of the second thin film transistor, and the first pixel electrode is electrically connected to a drain of the second thin film transistor;
   a first via hole and a second via hole, wherein the first via hole and the second via hole respectively are arranged on same straight lines with the first thin film transistor and the second thin film transistor along a direction perpendicular to the first data line as well as the second data line, the second pixel electrode is electrically connected to the drain of the first thin film transistor through the first via hole, and the first pixel electrode is electrically connected to the drain of the second thin film transistor through the second via hole.

2. The array substrate as claimed in claim 1, wherein the first pixel electrode and the second pixel electrode respectively have a first aperture area and a second aperture area formed there-above, the first aperture area and the second aperture area are aligned along the second direction.

3. An array substrate comprising:
   a first data line and a second data line, wherein the first data line and the second data line extend along a first direction and are spacedly disposed along a second direction perpendicular to the first direction;
   a first pixel electrode and a second pixel electrode, wherein the first pixel electrode and the second pixel electrode are disposed between the first data line and the second data line and spaced from each other along the second direction, the first pixel electrode and the first data line are disposed adjacent to each other, the second pixel electrode and the second data line are disposed adjacent to each other, the first data line is configured for supplying a grayscale voltage to the second pixel electrode, and the second data line is configured for supplying a grayscale voltage to the first pixel electrode.

4. The array substrate as claimed in claim 3, wherein the array substrate further comprises a first thin film transistor and a second thin film transistor disposed between the first data line and the second data line, the first data line is electrically connected to one of a source and a drain of the first thin film transistor, the second pixel electrode is electrically connected to the other one of the source and the drain of the first thin film transistor, the second data line is electrically connected to one of a source and a drain of the second thin film transistor, and the first pixel electrode is electrically connected to the other one of the source and the drain of the second thin film transistor.

5. The array substrate as claimed in claim 4, wherein the first thin film transistor and the second thin film transistor are spacedly disposed along the first direction and respectively at opposite sides of the first pixel electrode as well as the second pixel electrode.

6. The array substrate as claimed in claim 5, wherein the first pixel electrode and the second pixel electrode are aligned along the second direction.

7. The array substrate as claimed in claim 6, wherein the first pixel electrode and the second pixel electrode respectively have a first aperture area and a second aperture area formed there-above, the first aperture area and the second aperture area are aligned along the second direction.

8. The array substrate as claimed in claim 5, wherein the array substrate further comprises a first scan line and a second scan line, the first scan line and the second scan line extend along the second direction and spaced from each other along the first direction; the first pixel electrode, the second pixel electrode, the first thin film transistor and the second thin film transistor further are located between the first scan line and the second scan line, the first scan line is disposed adjacent to the first thin film transistor and electrically connected to a gate of the first thin film transistor, the second scan line is disposed adjacent to the second thin film transistor and electrically connected to a gate of the second thin film transistor.

9. The array substrate as claimed in claim 4, wherein the array substrate further is formed with a first via hole and a second via hole, the second pixel electrode is electrically connected to the other one of the source and the drain of the first thin film transistor through the first via hole, the first pixel electrode is electrically connected to the other one of the source and the drain of the second thin film transistor through the second via hole.

10. The array substrate as claimed in claim 9, wherein the first via hole and the first thin film transistor are spacedly disposed along the second direction, the second via hole and the second thin film transistor are spacedly disposed along the second direction.

11. The array substrate as claimed in claim 10, wherein the first via hole and the first thin film transistor are disposed on a same straight line along the second direction, the second via hole and the second thin film transistor are disposed on a same straight line along the second direction.

12. A liquid crystal display device comprising an array substrate, the array substrate comprising:
   a first data line and a second data line, wherein the first data line and the second data line extend along a first direction and are spacedly disposed along a second direction perpendicular to the first direction;
   a first pixel electrode and a second pixel electrode, wherein the first pixel electrode and the second pixel electrode are disposed between the first data line and the second data line and spaced from each other along the second direction, the first pixel electrode and the first data line are disposed adjacent to each other, the second pixel electrode and the second data line are disposed adjacent to each other, the first data line is configured for supplying a grayscale voltage to the second pixel electrode, and the second data line is configured for supplying a grayscale voltage to the first pixel electrode.

13. The liquid crystal display device as claimed in claim 12, wherein the array substrate further comprises a first thin film transistor and a second thin film transistor disposed between the first data line and the second data line, the first data line is electrically connected to one of a source and a drain of the first thin film transistor, the second pixel electrode is electrically connected to the other one of the source and the drain of the first thin film transistor, the second data line is electrically connected to one of a source and a drain of the second thin film transistor, and the first pixel electrode is electrically connected to the other one of the source and the drain of the second thin film transistor.

14. The liquid crystal display device as claimed in claim 13, wherein the first thin film transistor and the second thin film transistor are spacedly disposed along the first direction and respectively at opposite sides of the first pixel electrode as well as the second pixel electrode.

15. The liquid crystal display device as claimed in claim 14, wherein the first pixel electrode and the second pixel electrode are aligned along the second direction.

16. The liquid crystal display device as claimed in claim 15, wherein the first pixel electrode and the second pixel electrode respectively have a first aperture area and a second aperture area formed there-above, the first aperture area and the second aperture area are aligned along the second direction.

17. The liquid crystal display device as claimed in claim 16, wherein the array substrate further comprises a first scan line and a second scan line, the first scan line and the second scan line extend along the second direction and spaced from each other along the first direction; the first pixel electrode, the second pixel electrode, the first thin film transistor and the second thin film transistor further are located between the first scan line and the second scan line, the first scan line is disposed adjacent to the first thin film transistor and electrically connected to a gate of the first thin film transistor, the second scan line is disposed adjacent to the second thin film transistor and electrically connected to a gate of the second thin film transistor.

18. The liquid crystal display device as claimed in claim 13, wherein the array substrate further is formed with a first via hole and a second via hole, the second pixel electrode is electrically connected to the other one of the source and the drain of the first thin film transistor through the first via hole, the first pixel electrode is electrically connected to the other one of the source and the drain of the second thin film transistor through the second via hole.

19. The liquid crystal display device as claimed in claim 18, wherein the first via hole and the first thin film transistor are spacedly disposed along the second direction, the second via hole and the second thin film transistor are spacedly disposed along the second direction.

20. The liquid crystal display device as claimed in claim 19, wherein the first via hole and the first thin film transistor are disposed on a same straight line along the second direction, the second via hole and the second thin film transistor are disposed on a same straight line along the second direction.

\* \* \* \* \*